(12) United States Patent
Oki et al.

(10) Patent No.: US 11,215,680 B2
(45) Date of Patent: Jan. 4, 2022

(54) CAPACITOR CHARGING PERFORMANCE MONITORING SYSTEM OF PRODUCTION MACHINE

(71) Applicant: FUJI CORPORATION, Chiryu (JP)

(72) Inventors: Hideaki Oki, Anjo (JP); Satoshi Osaki, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 29 days.

(21) Appl. No.: 16/639,907

(22) PCT Filed: Aug. 24, 2017

(86) PCT No.: PCT/JP2017/030263
§ 371 (c)(1),
(2) Date: Feb. 18, 2020

(87) PCT Pub. No.: WO2019/038873
PCT Pub. Date: Feb. 28, 2019

(65) Prior Publication Data
US 2021/0132159 A1 May 6, 2021

(51) Int. Cl.
*G01R 31/64* (2020.01)
*H02J 7/00* (2006.01)
(Continued)

(52) U.S. Cl.
CPC ............ *G01R 31/64* (2020.01); *H02J 7/0047* (2013.01); *H02J 7/345* (2013.01); *G03B 15/05* (2013.01); *H05K 13/081* (2018.08)

(58) Field of Classification Search
CPC ............. G01R 31/389; G01R 31/3835; G01R 31/3828; G01R 31/007; G01R 31/3842;
(Continued)

(56) References Cited

U.S. PATENT DOCUMENTS 9,024,592 B2 * 5/2015 Jeon ..................... G06F 1/263
320/167
9,470,739 B2 * 10/2016 Govindaraj ............ B60L 50/10
(Continued)

FOREIGN PATENT DOCUMENTS

JP   H0521580 B2 *  3/1993  ......... G01S 7/52077
JP   5-215800 A    8/1993
(Continued)

OTHER PUBLICATIONS

Extended European Search Report dated Jul. 16, 2020 in Patent Application No. 17922424.1, 8 pages.
(Continued)

*Primary Examiner* — Vinh P Nguyen
(74) *Attorney, Agent, or Firm* — Oblon, McClelland, Maier & Neustadt, L.L.P.

(57) ABSTRACT

A system for monitoring the charging performance of a capacitor in an electric circuit in a manufacturing machine installed in a production line includes a charging voltage detecting section for detecting the charging voltage of the capacitor. A control device of the production machine measures, as the charging time, a time from starting charging to a time when a specified charging complete determination voltage that can be used to determine when the charging voltage of the capacitor has reached full charge is reached based on the charging voltage of the capacitor detected by charging voltage detecting section, determines whether the capacitor has deteriorated by determining whether the measured charging time is equal to or less than a specified deterioration threshold value, and upon determining that the capacitor has deteriorated, issues a warning to an operator via a display or sound.

10 Claims, 7 Drawing Sheets

(51) Int. Cl.
  *H02J 7/34* (2006.01)
  *H05K 13/08* (2006.01)
  *G03B 15/05* (2021.01)

(58) Field of Classification Search
  CPC .... G01R 31/64; G01R 19/10; G01R 19/2513; G01R 1/00; G01R 27/2605; G01R 31/016; G01R 31/40; G01R 35/005; G01R 31/3648; G01R 31/00; H01M 10/4264; G06F 3/044; G06F 3/0418; G06F 2203/04112; G06F 1/30; G06F 2203/04111; H01G 9/155; H01G 11/34; H01G 11/58; H01G 9/14; H05G 1/12; G03B 15/05; H02J 7/0047; H02J 7/345; H05K 13/081
  See application file for complete search history.

(56) References Cited

U.S. PATENT DOCUMENTS

| | | | |
|---|---|---|---|
| 10,114,056 B2* | 10/2018 | Kawanaka | G01R 27/025 |
| 10,161,980 B2* | 12/2018 | Kawanaka | G01R 31/382 |
| 10,241,144 B2* | 3/2019 | Tamura | G01R 31/64 |
| 10,627,436 B2* | 4/2020 | Chang | H03K 17/962 |
| 2006/0087253 A1 | 4/2006 | Chen | |
| 2007/0216425 A1* | 9/2007 | Okamura | H01G 9/155 |
| | | | 324/678 |
| 2011/0221281 A1* | 9/2011 | Miyamoto | H02M 1/32 |
| | | | 307/151 |

FOREIGN PATENT DOCUMENTS

| | | |
|---|---|---|
| JP | 2002-98725 A | 4/2002 |
| JP | 2004-344946 A | 12/2004 |
| JP | 2006-119350 A | 5/2006 |
| JP | 2007-219148 A | 8/2007 |
| JP | 2013-120741 A | 6/2013 |
| WO | WO 2014/076836 A1 | 5/2014 |

OTHER PUBLICATIONS

International Search Report dated Nov. 7, 2017 in PCT/JP2017/030263 filed Aug. 24, 2017, 2 pages.

* cited by examiner

CAPACITOR CHARGING PERFORMANCE MONITORING SYSTEM OF PRODUCTION MACHINE

TECHNICAL FIELD

The present specification discloses technology related to a capacitor charging performance monitoring system for monitoring the charging performance of capacitors in electric circuits mounted on production machines installed in a production line.

BACKGROUND ART

For example, in a component mounter installed in a production line (component mounting line) for manufacturing a component-mounted board, an image recognizing system for using a camera to capture an image of a component held by a suction nozzle or a reference mark of a circuit board onto which the component is to be mounted and recognizing the image is installed, and a lighting device for illuminating an object to be captured (a component or a reference mark) when capturing the image is attached to the camera. Generally, as described in patent literature 1 (JP-A-2006-119350), a lighting device of a camera is provided with a capacitor for causing a large current to flow through light-emitting elements such as LEDs, the capacitor is charged prior to imaging, and discharge from the capacitor is performed when imaging to cause a large current to flow through the light-emitting elements to emit light with high brightness so as to illuminate an imaging target.

CITATION LIST

Patent Literature

Patent literature 1: JP-A-2006-119350

BRIEF SUMMARY

Technical Problem

With the lighting device, when a capacitor deteriorates due to long-term use, the capacitance of the capacitor decreases, and the amount of charge that can be charged in the capacitor decreases, so that the current flowing through the light-emitting element when the capacitor is discharged decreases, and the amount of light emitted from the light-emitting element decreases.

Since a camera with a lighting device mounted on a production machine such as a component mounter is used for image recognition of an imaging target, if the amount of light emitted from a light-emitting device of a lighting device decreases due to deterioration of a capacitor, the amount of illumination light for illuminating the imaging target becomes insufficient, the definition of an image captured by a camera decreases, thereby deteriorating the image recognition accuracy. Such deterioration of the image recognition accuracy also causes deterioration of the quality of a product to be produced, production of defective products due to erroneous recognition, or stoppages in production due to an image processing error or the like.

Solution to Problem

To solve the above problems, disclosed herein is a capacitor charging performance monitoring system of a production machine for monitoring charging performance of a capacitor in an electric circuit installed on a production machine provided in a production line, the system including: a charging voltage detecting section configured to detect a charging voltage of the capacitor; a charging time measuring section configured to measure, as a charging time, a time from starting charging to a time when a specified charging complete determination voltage that can be used to determine when the charging voltage of the capacitor has reached full charge is reached based on the charging voltage of the capacitor detected by the charging voltage detecting section; and a charging performance determining section configured to determine whether the capacitor has deteriorated by determining whether the charging time measured by the charging time measuring section is equal to or less than a specified deterioration threshold value, wherein the charging performance determining section issues a warning upon determining that the capacitor has deteriorated. The warnings may be issues via display or sound using a display device provided on the production machine or a mobile terminal carried by an operator.

There is a relationship such that as the capacitor deteriorates due to long-term use, the capacitance of the capacitor decreases, and the charging time from the start of charging of the capacitor to the completion of charging decreases. Using this relationship, the charging time of the capacitor is measured by the charging time measuring section, and when the measured value becomes equal to or lower than a specified deterioration determination threshold value, it is determined that the capacitor has deteriorated and a warning is issued. Thus, when the capacitor has deteriorated to a specified level, it is possible to warn the operator of the deterioration of the capacitor, and to prompt the operator to take measures such as replacement of the capacitor before a problem due to the deterioration of the capacitor occurs.

DESCRIPTION OF EMBODIMENTS

Hereinafter, an embodiment in which a component mounter equipped with a camera with a lighting device is used as a production machine will be described.

Figure 1:
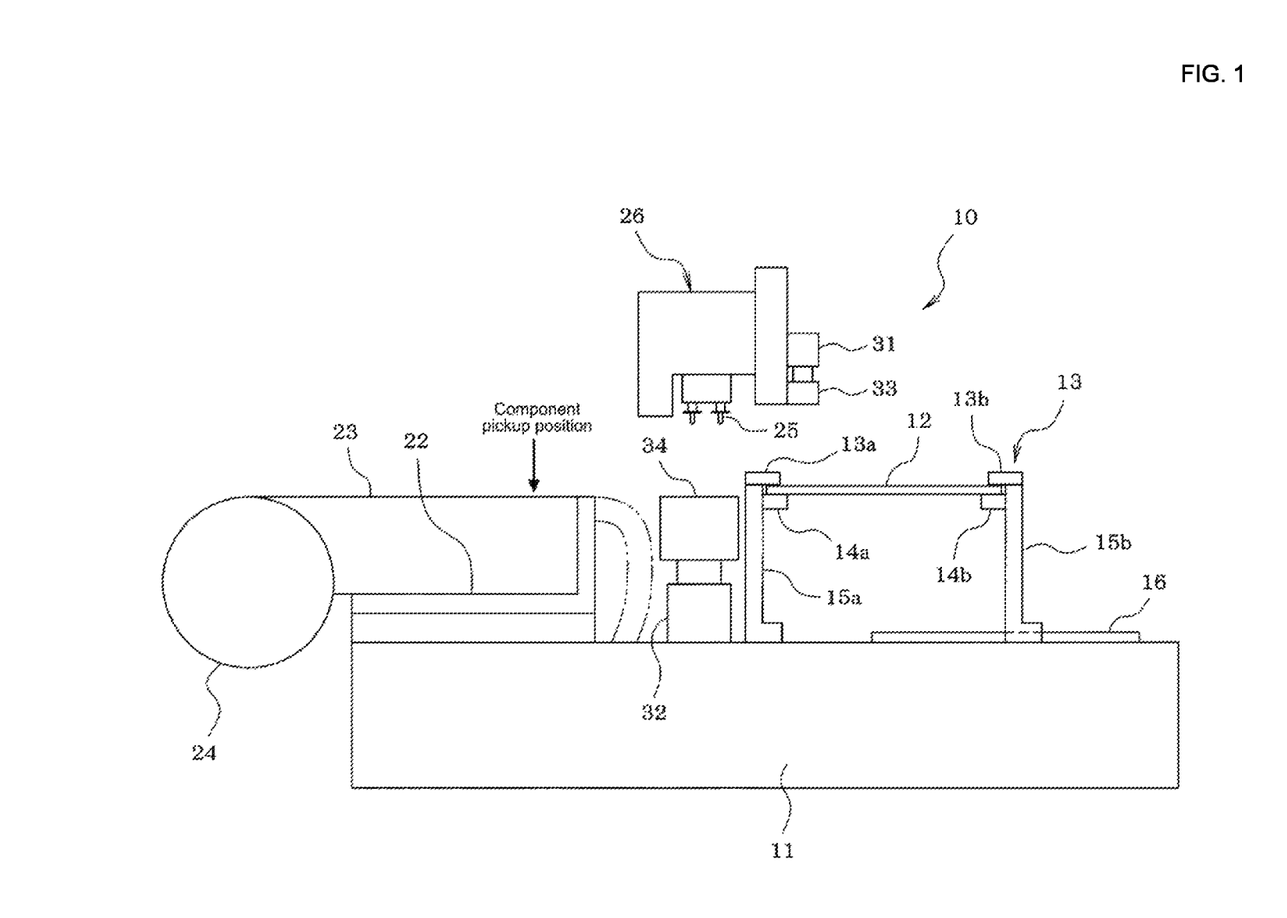
FIG. 1 is a side view for illustrating the configuration of a component mounter according to an embodiment.

First, the configuration of component mounter 10 will be described with reference to FIG. 1.

At least one component mounter 10 is installed in a component mounting line, which is a production line for manufacturing a component-mounted board. Conveyor 13 that conveys circuit board 12 is provided on base 11 of component mounter 10 (below, the conveyance direction of circuit board 12 by conveyor 13 is referred to as the X direction, and the direction perpendicular to that is referred to as the Y direction). Of support members 15a and 15b that support the two conveyor rails 13a and 13b and conveyor belts 14a and 14b that configure conveyor 13, support member 15a is fixed at a specified position, with the support member 15b on the opposite side being adjusted in the Y direction along guide rail 16 by a screw mechanism (not shown) or the like such that the width of conveyor 13 (the gap between conveyor rails 13a and 13b) is adjustable to the width of circuit board 12.

Also, feeder setting table 22 is provided to the side of conveyor 13 on base 11, with multiple feeders 23 being removably set on feeder setting table 22 in the Y direction. Set on each feeder 23 is a reel 24 on which is wound component supply tape housing many components at a fixed pitch, with the reel 24 being set such that the leading component of the component supply tape pulled from the reel 24 is positioned at a component pickup position (position at which the component is picked up by suction nozzle 25).

Component mounter 10 is provided with head moving device 27 (refer to FIG. 2) for moving mounting head 26 in the following order: component pickup position—>component imaging position—>component mounting position. One or multiple suction nozzles 25 that pick up a component fed by a feeder to the component pickup position are held on mounting head 26 facing downwards, and the suction nozzle 25 is lowered and raised during component pickup operation and component mounting operation.

Also, component mounter 10 is provided with mark imaging camera 31 that is moved together with mounting head 24 and that images from above reference marks or the like provided on circuit board 12, and component imaging camera 32 that images from below a component held by suction nozzle 25. Component imaging camera 32 is fixed facing upwards in a space between conveyor 13 and feeder setting table 22 on base 11. Each camera 31, 32 is provided with a lighting device 33, 34, respectively, for illuminating an object to be imaged. The configuration of the lighting devices 33, 34 will be described later.

Figure 2:
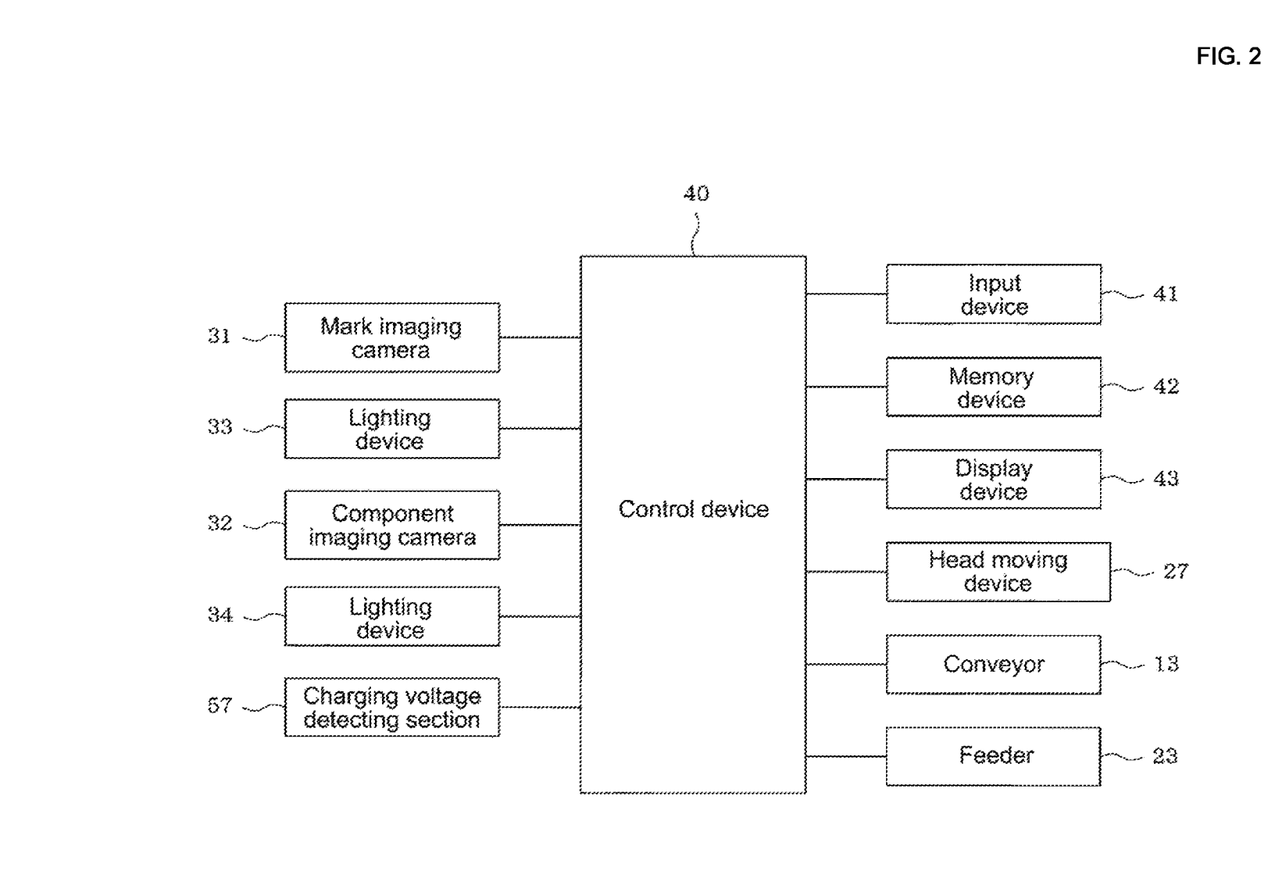
FIG. 2 is a block diagram showing the configuration of a control system of the component mounter.

As shown in FIG. 2, connected to control device 40 of component mounter 10 are input device 41 such as a keyboard, mouse, or touch panel, memory device 42 such as a hard disk, RAM, or ROM that memorizes the capacitor charging performance monitoring program of FIGS. 8 and 9 that is described later and the like, and display device 43 such as an LCD display or CRT.

Control device 40 of component mounter 10 is configured by one or multiple computers (CPUs), functions as a control section for controlling the operation of the respective functions of component mounter 10, and also functions as an image processing section for processing an image captured by mark imaging camera 31 and component imaging camera 32 and recognizing a target object.

Control device 40 of component mounter 10 uses mark imaging camera 31 to image from above reference marks of circuit board 12 that is clamped having been conveyed to a specified position by conveyor 13 and recognizes the reference marks, then measures each component mounting position on circuit board 12 based on the positions of the reference marks, and moves mounting head 26 in the order of component pickup position, component imaging position, component mounting position, causes suction nozzle 25 of mounting head 26 to pick up a component supplied by feeder 23, uses component imaging camera 32 to image the component, and processes the captured image to recognize the shape of the component and measure the component shape data, then mounts the component after deciding the component mounting position of the component on circuit board 12 so as to correct the deviation of the component pickup position.

Figure 3:
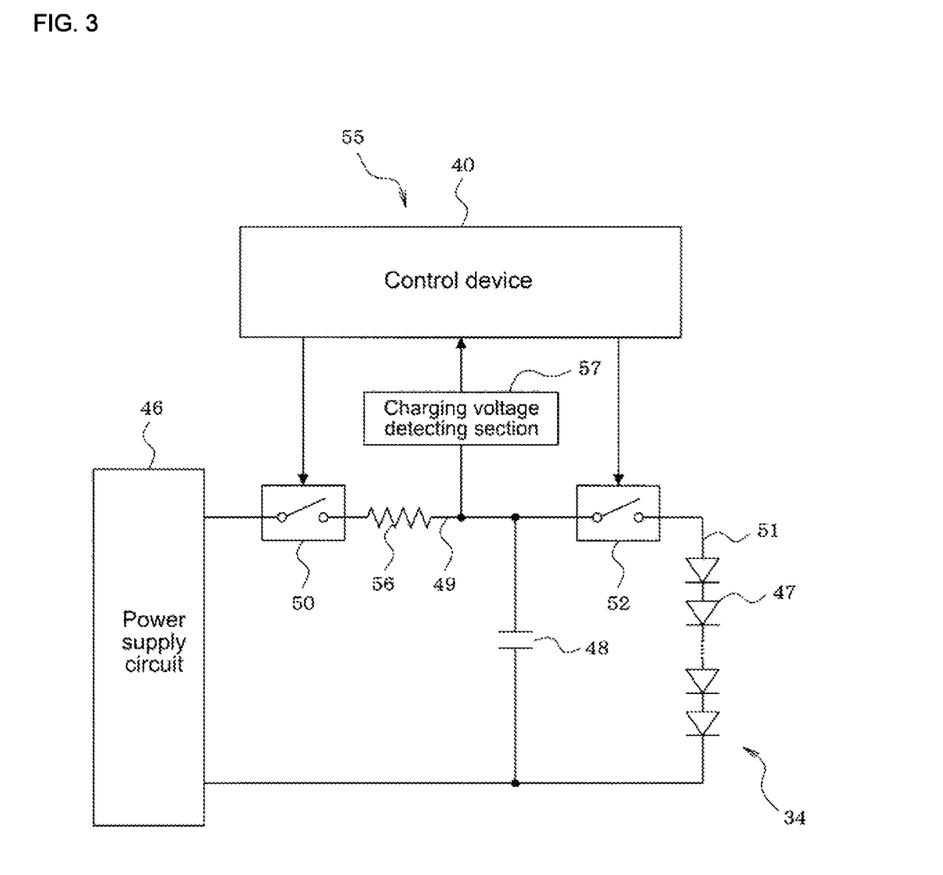
FIG. 3 is a circuit diagram showing the circuit configuration of the lighting device and capacitor charge performance monitoring system.

The configuration of lighting devices 33 and 34 of cameras 31 and 32 is illustrated only by the configuration of lighting device 34 of component imaging camera 32 in FIG. 3, and each of them includes power supply circuit 46 for supplying a power source of a specified DC voltage, light-emitting element 47 such as an LED or a flash lamp for generating illumination light, capacitor 48 such as an electrolytic capacitor charged by a current supplied from power supply circuit 46, switching element 50 such as a transistor or a relay for turning on/off charging circuit 49 between power supply circuit 46 and capacitor 48, and switching element 52 such as a transistor or a relay for turning on/off discharging circuit 51 between capacitor 48 and light-emitting element 47, wherein the switching operation of each of the switching elements 50 and 52 is controlled by control device 40 of component mounter 10 as follows.

Control device 40 of component mounter 10 performs control such that, before imaging of the target object, switching element 50 of charging circuit 49 is turned on to charge capacitor 48 in a state with switching element 52 of discharge circuit 51 turned off, and after charging is completed, switching element 50 of charging circuit 49 is turned off, then, when imaging is performed, switching element 52 of discharge circuit 51 is turned on to discharge the electric charge charged in capacitor 48, making a large current flow in light-emitting element 47 such that light-emitting element 47 emits light with high brightness, and the imaging target is imaged by camera 31, 32 while the imaging target is being illuminated.

Note that, only one capacitor 48 may be used, or multiple capacitors may be connected in parallel, in other words, the number of capacitors required to charge a specified amount of electric charge for generating the amount of illumination light necessary for image capturing (image recognition) of the imaging target may be connected in parallel. Further, when multiple light-emitting elements 47 are connected to discharge circuit 51, they may be connected in series or in parallel.

Note that, since lighting device 34 of component imaging camera 32 generates a larger amount of illumination light than lighting device 33 of mark imaging camera 31, deterioration of capacitor 48 caused by long-term use is problematic. That is, with lighting device 34, when capacitor 48 deteriorates due to long-term use, the capacitance of capacitor 48 decreases and the amount of charge charged in capacitor 48 decreases, such that the current flowing through light-emitting element 47 at the time of discharging capacitor 48 decreases and the amount of light emitted by light-emitting element 47 decreases. As a result, the amount of illumination light for illuminating the imaging target is insufficient due to the deterioration of capacitor 48, such that the sharpness of the image captured by component imaging camera 32 is lowered, and the image recognition accuracy worsens. Such worsening of the image recognition accuracy also causes deterioration of the product quality due to deterioration of the component mounting accuracy, production of defective products by erroneous recognition, and stoppages of production due to an image processing error or the like.

Thus, with component mounter 10 of the present embodiment, a capacitor charging performance monitoring system 55 for monitoring the charging performance of capacitor 48 of lighting device 34 of component imaging camera 32 is provided, and when capacitor 48 has deteriorated to a specified level, a warning regarding the deterioration of capacitor 48 is issued to the operator. Hereinafter, the configuration of capacitor charging performance monitoring system 55 will be described.

Voltage detection resistor 56 for detecting the charging voltage of capacitor 48 is connected to charging circuit 49 of capacitor 48, the potential between voltage detection resistor 56 and capacitor 48 is detected by charging voltage detecting section 57 as the charging voltage of capacitor 48, and the detected value of the charging voltage is read into control device 40 of component mounter 10. Control device 40 of component mounter 10 executes the capacitor charging performance monitoring program of FIGS. 8 and 9, which will be described later, to function as a charging time measuring section that measures, as a charging time, a time from starting charging to a time when a specified charging complete determination voltage that can be used to determine when the charging voltage of the capacitor 48 has reached full charge is reached based on the charging voltage of the capacitor 48 detected by charging voltage detecting section 57, and also functions as a charging performance determining section configured to determine whether the capacitor 48 has deteriorated by determining whether the charging time measured by the charging time measuring section is equal to or less than specified deterioration threshold value B.

Figure 4:
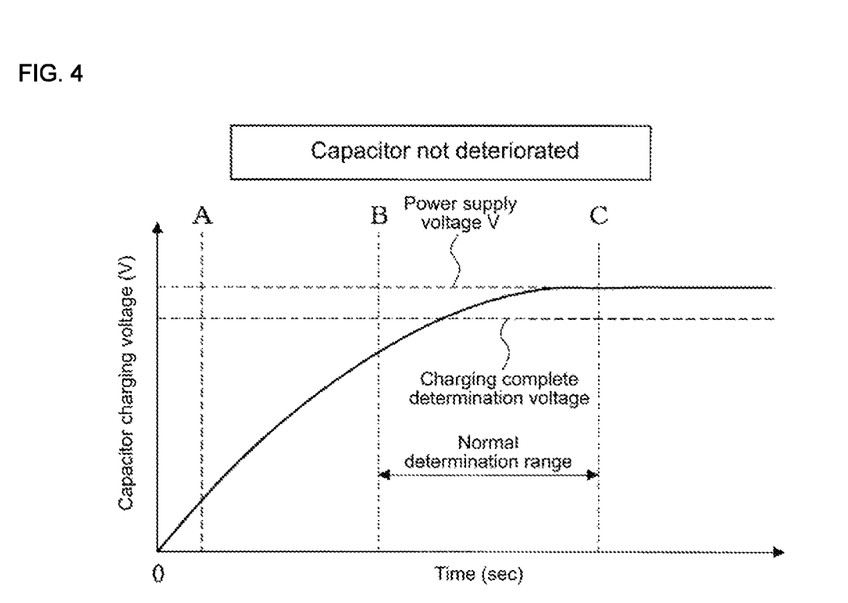
FIG. 4 is a graph showing changes in the detected values of the charging voltages of a capacitor when the capacitor is not deteriorated.

As shown in FIG. 4, the charging performance of capacitor 48 is such that the charging voltage of capacitor 48 rises exponentially with the time constant τ as time elapses after the start of charging until finally matching the output voltage of power supply circuit 46. Here, the time constant τ is calculated by the following equation.

Time constant $\tau = R \times C$

R: Resistance value [Ω] of charging circuit 49
C: Capacitance [F] of capacitor 48

Figure 5:
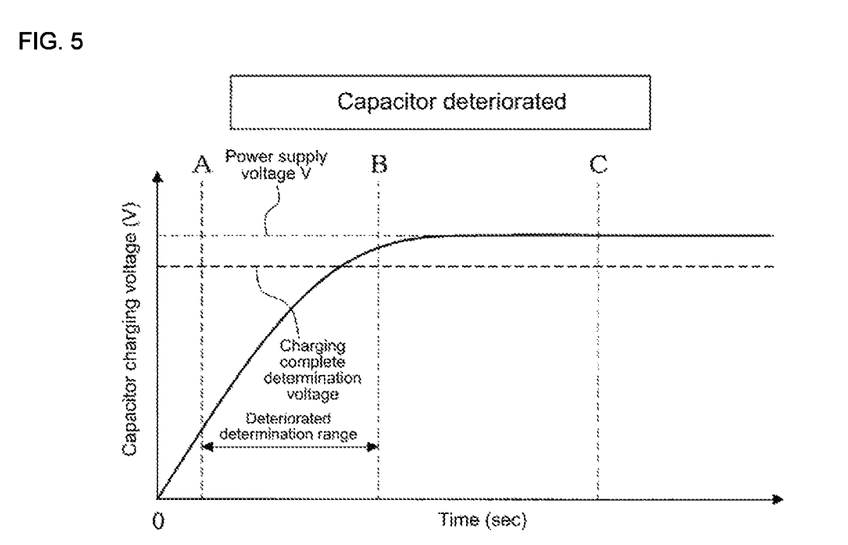
FIG. 5 is a diagram showing changes in detected values of charging voltages of a capacitor when the capacitor is deteriorated.

Since the capacitance of capacitor 48 decreases as capacitor 48 deteriorates, the time constant τ decreases as capacitor 48 deteriorates, thereby shortening the charging time until the charging of capacitor 48 is completed, as shown in FIG. 5.

Thus, with the present embodiment, control device 40 of component mounter 10 measures, as the charging time, a time from starting charging to a time when a specified charging complete determination voltage that can be used to determine when the charging voltage of the capacitor 48 has reached full charge is reached based on the charging voltage of the capacitor 48 detected by charging voltage detecting section 57, and determines whether the capacitor 48 has deteriorated by determining whether the measured charging time is equal to or less than specified deterioration threshold value B (see FIGS. 4 and 5). Here, the charging complete determination voltage may be set to, for example, a voltage of 90% of the power supply voltage V or a voltage slightly higher than that, or a voltage slightly lower than that, in short, may be set to a voltage at which it can be determined that charging is almost complete.

In this case, the deterioration determination threshold value B may be set by any one of the following methods (1) to (3), for example.

Method of Setting Deterioration Determination Threshold B (1)

A minimum electrostatic capacitance Cmin capable of charging a minimum charge amount Q (=C×V) required to generate a minimum illumination light amount necessary to perform normal image recognition of an imaging target is obtained, a charging time necessary to charge capacitor 48 of the minimum electrostatic capacitance Cmin to a charging complete determination voltage is calculated, and this charging time is set as deterioration determination threshold value B. Since the power supply voltage V for charging capacitor 48 is fixed, by calculating the time constant τ=R×Cmin, it is possible to calculate the charging time required for charging capacitor 48 having the minimum capacitance Cmin to the charging complete determination voltage.

Method of Setting Deterioration Determination Threshold B (2)

The measured charging time in the first operation after the installation of component mounter 10 in the component mounting line or in the first operation after the exchange of capacitor 48 is taken as a normal charging time, and deterioration determination threshold B is set to a time shorter than the normal charging time by a time corresponding to a predetermined deterioration amount. Here, the time corresponding to the specified amount of deterioration may be, for example, a time corresponding to a specified percentage of the normal charging time.

Method of Setting Deterioration Determination Threshold B (3)

The charging time in a case of using a capacitor having the smallest capacitance in the product variation range of the capacitance of capacitor 48 is calculated as the normal charging time, and deterioration determination threshold B is set to a time shorter than the normal charging time by a time corresponding to a predetermined deterioration amount. Here, the time corresponding to the specified amount of deterioration may be, for example, a time corresponding to a specified percentage of the normal charging time. The product specification data provided by the manufacturer or the like of capacitor 48 may be used as the product variation range of the capacitance of capacitor 48.

The setting of deterioration determination threshold B may be automatically performed by control device 40 of component mounter 10 using any of the methods (1) to (3) or the like, or an operator may calculate deterioration determination threshold B using any of the methods (1) to (3) or the like, and may store deterioration determination threshold B in memory device 42 by operating input device 41. Alternatively, deterioration determination threshold value B may be calculated and stored in memory device 42 by the company that manufactures or sells component mounter 10.

Figure 6:
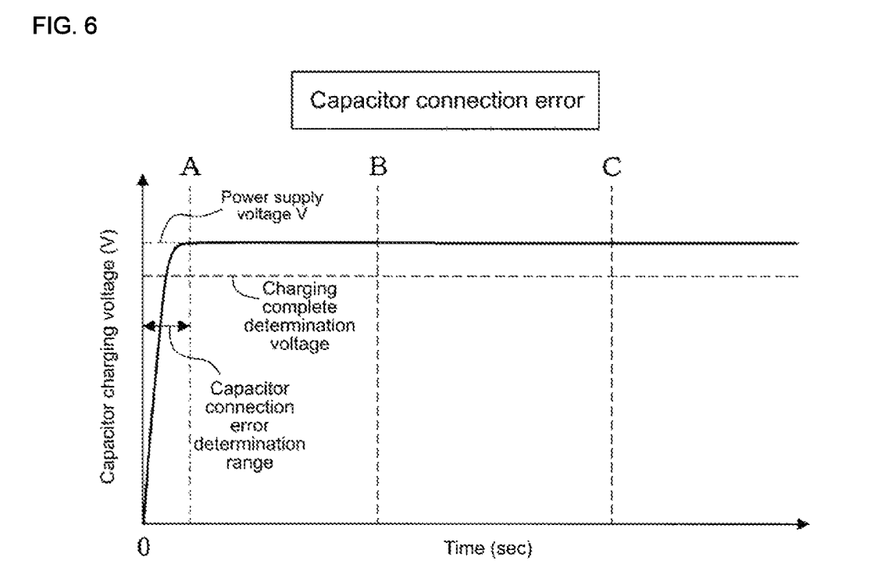
FIG. 6 is a diagram showing changes in detected values of charging voltages of a capacitor during charging when the capacitor cannot be normally charged due to a connection error of the capacitor.

Further, in the present embodiment, as shown in FIG. 6, control device 40 of component mounter 10 has, as a determination threshold value, in addition to deterioration determination threshold value B, connection error determination threshold value A that is smaller than deterioration determination threshold value B, and when the measured charging time is equal to or less than connection error determination threshold value A, it is determined that capacitor 48 cannot be normally charged due to a connection error of capacitor 48, and a warning regarding this is issued. Here, connection error determination threshold value A may be set to an appropriate value within a range of, for example, around several percent to around ten percent of deterioration determination threshold value B.

Figure 7:
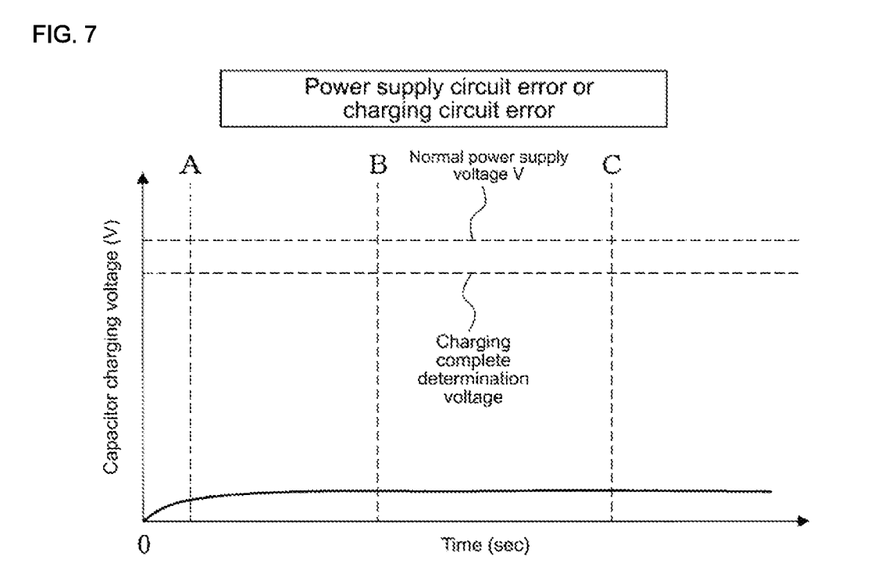
FIG. 7 is a diagram showing changes in detected values of charging voltages of a capacitor during charging when the capacitor cannot be normally charged due to an error of the power supply circuit or an error of the charging circuit.

Further, in the present embodiment, as shown in FIG. 7, control device 40 of component mounter 10 has, as a determination threshold value, in addition to deterioration determination threshold value B, charging error determination threshold value C that is larger than deterioration determination threshold value B, and when the measured charging time is equal to or less than charging error determination threshold value A, it is determined that capacitor 48 cannot be normally charged due to an error of power supply circuit 46 or an error of charging circuit 49, and a warning regarding this is issued. Here, charging error determination threshold value C may be set to an appropriate value within a range of about 1.5 to 3 times deterioration determination threshold value B, for example.

If control device 40 of component mounter 10 determines that capacitor 48 has deteriorated, has a connection error, or has a charging error, an operator is prompted to take measures such as replacing capacitor 48 by warning the operator using display or sound via display device 43 provided in component mounter 10 or a mobile terminal carried by the operator.

Since the deterioration of capacitor 48 does not progress in a short period of time, the charging time of capacitor 48 need not be measured every time capacitor 48 is charged, and the charging time of capacitor 48 may be measured every time a predetermined period elapses, for example, every time the operating quantity of component mounter 10 or the number of times capacitor 48 has been charged reaches a predetermined value.

Alternatively, the charging time of capacitor 48 may be measured when capacitor 48 is first charged every time component mounter 10 is operated. Accordingly, in a case in which capacitor 48 has deteriorated, has a connection error, or has a charging error, it can be detected at the start of production and a warning can be issued, and production can be started after the operator performs measures such as replacement of capacitor 48 in response to the warning.

In either case, the charging time of capacitor 48 may be measured again when it is determined that capacitor 48 has deteriorated, has a connection error, or has a charging error, and as a result, if it is determined that capacitor 48 has deteriorated, has a connection error, or has a charging error again, the determination result may be confirmed and a warning issued. Accordingly, erroneous determination due to temporary noise or the like can be prevented, and the reliability of the determination result can be improved.

Figure 8:
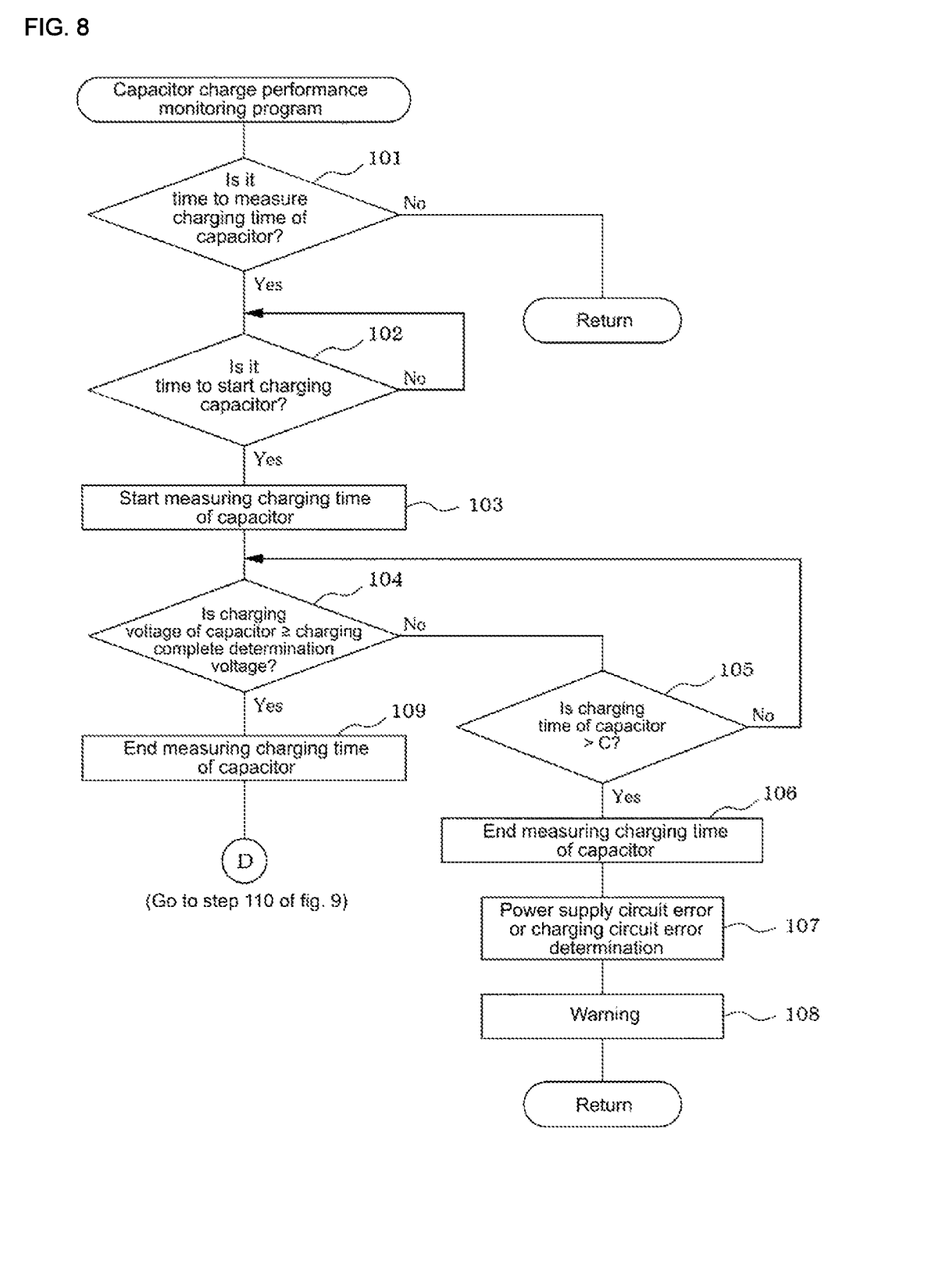
FIG. 8 is a (first) flow chart showing a processing flow of a capacitor charge performance monitoring program.
Figure 9:
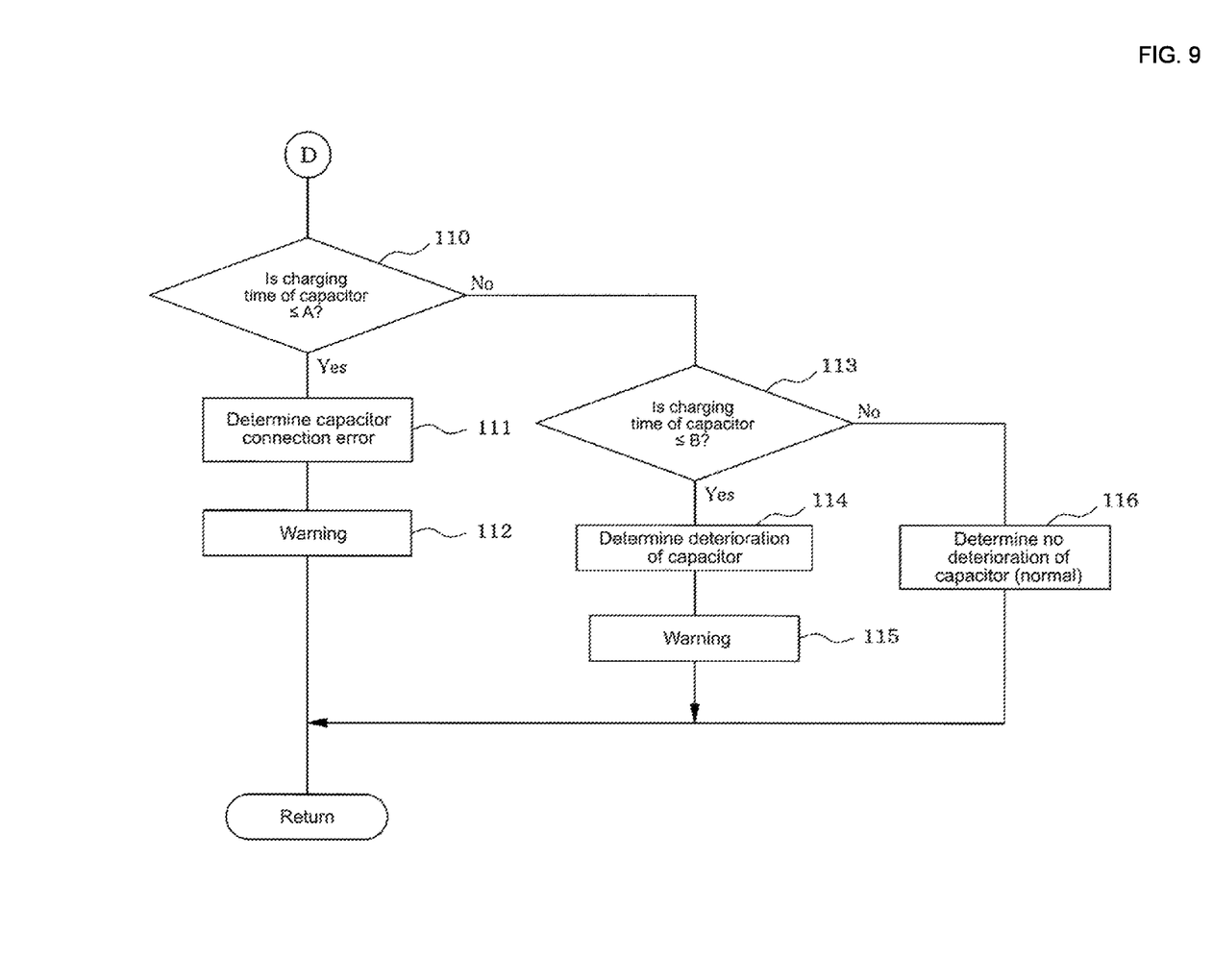
FIG. 9 is a (second) flow chart showing a processing flow of a capacitor charge performance monitoring program.

The monitoring of the charging performance of capacitor 48 of the present embodiment described above is executed by control device 40 of component mounter 10 at predetermined intervals in accordance with the capacitor charging performance monitoring program of FIGS. 8 and 9. The capacitor charging performance monitoring program of FIGS. 8 and 9 serves as a charging time measuring section and a charging performance determining section.

When the program is started, first, in step 101, it is determined whether it is time to measure the charging time of capacitor 48. Here, the time at which the charging time of capacitor 48 is measured is, for example, the time at which capacitor 48 is first charged every time component mounter 10 is operated, or every time a predetermined period elapses (for example, every time the operating quantity of component mounter 10 or the number of times capacitor 48 is charged reaches a predetermined value). If it is determined in step 101 that it is not time to measure the charging time of capacitor 48, the program is terminated without performing subsequent processing.

If it is determined in step 101 that it is time to measure the charging time of capacitor 48, processing proceeds to step 102 to wait until the charging start timing of capacitor 48. Then, when the charging start timing of capacitor 48 is reached, processing proceeds to step 103, and measurement of the charging time of capacitor 48 is started.

Next, proceeding to step 104, it is determined whether the charging voltage of capacitor 48 detected by charging voltage detecting section 57 has reached the charging complete determination voltage from which it can be determined that charging is complete, and if the charging complete determination voltage has not been reached, processing proceeds to step 105, where it is determined whether the charging time of capacitor 48 has exceeded charging error determination threshold value C that is larger than deterioration determination threshold value B, and if charging error determination threshold value C is not exceeded, processing returns to step 104. By repeating such processing, the measurement of the charging time of capacitor 48 is continued until the charging voltage of capacitor 48 detected by charging voltage detecting section 57 reaches the charging complete determination voltage within a range in which the charging time of capacitor 48 does not exceed charging error determination threshold value C.

During the measurement of the charging time of capacitor 48, if the charging time of capacitor 48 exceeds charging error determination threshold value C, processing proceeds from step 105 to step 106, and the measurement of the charging time of capacitor 48 is finished, and in step 107, it is determined that capacitor 48 cannot be normally charged due to an error of power supply circuit 46 or an error of charging circuit 49 (charging error). In this case, processing proceeds to step 108, where the operator is warned by display or sound of the determination result, and the program is terminated.

On the other hand, if the charging voltage of capacitor 48 detected by charging voltage detecting section 57 reaches the charging complete determination voltage prior to the charging time of capacitor 48 exceeding charging error determination threshold value C, processing proceeds from step 104 to step 109, and the measurement of the charging time of capacitor 48 is ended. Then, proceeding to step 110 of FIG. 9, it is determined whether the measured charging time of capacitor 48 is equal to or less than connection error determination threshold A that is smaller than deterioration determination threshold B. As a result, if it is determined that the charging time of capacitor 48 is equal to or less than connection error determination threshold value A, processing proceeds to step 111, where it is determined that capacitor 48 cannot be normally charged due to a connection error of capacitor 48, and in step 112, the determination result is issued as a warning to the operator by display or sound, and the program ends.

On the other hand, if it is determined in step 110 that the charging time of capacitor 48 is not equal to or less than connection error determination threshold value A, processing proceeds to step 113, and it is determined whether the charging time of capacitor 48 is equal to or less than deterioration determination threshold value B. As a result, if it is determined that the charging time of capacitor 48 is equal to or less than deterioration determination threshold value B, processing proceeds to step 114, where it is determined that capacitor 48 has deteriorated, and in step 115, a warning regarding the deterioration of capacitor 48 is issued to the operator by display or sound, and the program ends.

On the other hand, if it is determined in step 113 that the charging time of capacitor 48 is not equal to or less than deterioration determination threshold value B, processing proceeds to step 116, where it is determined that capacitor 48 has not deteriorated (normal), and the program ends.

According to the embodiment described above, control device 40 of component mounter 10 measures the charging time of capacitor 48 and determines that capacitor 48 has deteriorated when the measured value becomes equal to or less than specified deterioration determination threshold B by taking advantage of the relationship that as capacitor 48 deteriorates due to long-term use, the capacitance of capacitor 48 decreases and the charging time from the beginning of charging capacitor 48 to the end of charging capacitor 48 becomes shorter, such that a warning regarding the deterioration of capacitor 48 can be issued to an operator when capacitor 48 deteriorates to a specified level, and the operator can be prompted to take measures such as replacing capacitor 48 before a problem occurs due to the deterioration of capacitor 48. As a result, it is possible to prevent problem due to deterioration of capacitor 48, for example, worse product quality due to deterioration of image recognition accuracy, production of defective products due to erroneous recognition, production stoppages due to image processing errors, and the like.

Note that, in an embodiment above, the charging performance of capacitor 48 is monitored only for lighting device 34 of component imaging camera 32, but the charging performance of the capacitor may be monitored in the same manner for lighting device 33 of mark imaging camera 31. Further, the charging performance of capacitors in electric circuits other than those of lighting devices 33 and 34 of cameras 31 and 32 may be monitored in the same manner.

The charging performance of the capacitor may also be monitored in the same manner for the lighting device of a camera mounted on a mounting-related device such as an inspection device or a screen printing device installed in the component mounting line.

In addition, it goes without saying that the present disclosure may be implemented with various modifications within a range that does not deviate from the gist of the disclosure, such as a case where the charging performance of a capacitor may be monitored in the same manner for a capacitor in an electric circuit mounted in a production machine installed in a production line other than a component mounting line machine.

REFERENCE SIGNS LIST

10: component mounter (production machine);
12: circuit board;
13: conveyor;
23: feeder;
25: suction nozzle;
26: mounting head;
27: head moving device;
31: mark imaging camera;
32: component imaging camera;
33, 34: lighting device;
40: control device (charging time measuring section, charging performance determining section);
43: display device;
46: power supply circuit;
47: light-emitting element;
48: capacitor;
49: recharging circuit;
50: switching element;
51: discharging circuit;
52: switching element;
55: capacitor charging performance monitoring system;
56: voltage detection resistor;
57: charge voltage detecting section

The invention claimed is:

1. A component mounter, comprising:
    a camera with a lighting device for illuminating an object to be imaged, the lighting device including a capacitor;
    a charging voltage detecting section configured to detect a charging voltage of the capacitor; and
    a control device operatively connected to the camera and to the charging voltage detecting section, the control device configured to
        measure, as a charging time, a time from starting charging to a time when a specified charging complete determination voltage that can be used to determine when the charging voltage of the capacitor has reached full charge is reached based on the charging voltage of the capacitor detected by the charging voltage detecting section,
        determine whether the capacitor has deteriorated by determining whether the charging time is equal to or less than a deterioration determination threshold value, and
        issue a warning upon determining that the capacitor has deteriorated.

2. The component mounter according to claim 1, further comprising:
    a power supply circuit which supplies power to the camera; and
    a charging circuit switchably connected between the power supply circuit and the capacitor,
    wherein the control device has, as a determination threshold value and in addition to the deterioration determination threshold value, a charging error determination threshold value larger than the deterioration determination threshold value, and
    when the charging time exceeds the charging error determination threshold value, the control device is configured to determine that the capacitor cannot be normally charged due to an error of the power supply circuit or an error of the charging circuit, and issue a warning regarding the error.

3. The component mounter according to claim 1, wherein the control device has, as a determination threshold value and in addition to the deterioration determination threshold value, a connection error determination threshold value smaller than the deterioration determination threshold value, and
    when the charging time is equal to or less than the connection error determination threshold value, the control device is configured to determine that the capacitor cannot be normally charged due to a connection failure of the capacitor, and issue a warning regarding the error.

4. The component mounter according to claim 1, wherein the capacitor is charged before imaging with the camera and discharged when imaging is performed to cause a current to flow through a light-emitting element of the lighting device so as to cause the light-emitting element to emit light.

5. The component mounter according to claim 1, wherein the control device is configured to set a deterioration determination threshold, and obtain a minimum electrostatic capacity capable of charging a minimum amount of electric charge required for normal operation, calculate a charging time necessary for charging the capacitor of the minimum electrostatic capacity to a charging complete determination voltage, and set the charging time as the deterioration determination threshold.

6. The component mounter according to claim 1, wherein the control device is configured to set a deterioration determination threshold, and take, as a normal charging time, the charging time at a first operation time after installation of the component mounter or at a first operation time after replacement of the capacitor, and set the deterioration determination threshold to a time shorter than the normal charging time by a time corresponding to a specified deterioration amount.

7. The component mounter according to claim 6, wherein the control device is configured to set a time corresponding to a specified percentage of the normal charging time as a time corresponding to the specified deterioration amount.

8. The component mounter according to claim 1, wherein the control device is configured to set a deterioration determination threshold, and calculate, as a normal charging time, a charging time when using a capacitor having a smallest capacitance within a product variation range of the capacitance of the capacitor, and set the deterioration determination threshold to a time shorter than the normal charging time by a time corresponding to a specified deterioration amount.

9. The component mounter according to claim 1, wherein the control device is configured to measure a charging time of the capacitor when the capacitor is first charged every time the component mounter is operated.

10. The component mounter according to claim 1, wherein the control device is configured to measure the charging time of the capacitor every time an operating time of the component mounter or a charging frequency of the capacitor reaches a specified value.

* * * * *